United States Patent
Lin et al.

(10) Patent No.: US 8,742,587 B1
(45) Date of Patent: Jun. 3, 2014

(54) METAL INTERCONNECTION STRUCTURE

(71) Applicant: United Microelectronics Corp., Hsin-Chu (TW)

(72) Inventors: Yuh-Min Lin, Tainan (TW); Wen-Ting Chen, Chiayi (TW); Yi-Yu Wu, Chiayi County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/680,102

(22) Filed: Nov. 18, 2012

(51) Int. Cl.
*H01L 23/48* (2006.01)
*H01L 23/52* (2006.01)
*H01L 29/40* (2006.01)

(52) U.S. Cl.
USPC .............. 257/760; 257/758; 257/E21.575

(58) Field of Classification Search
USPC .................... 257/758, 760, E21.575
See application file for complete search history.

(56) References Cited

U.S. PATENT DOCUMENTS

| | | | | |
|---|---|---|---|---|
| 5,961,791 A * | 10/1999 | Frisa et al. | ........... | 204/192.1 |
| 6,982,200 B2 * | 1/2006 | Noguchi et al. | ........... | 438/253 |
| 7,078,336 B2 * | 7/2006 | Cheng et al. | ........... | 438/637 |
| 7,339,256 B2 * | 3/2008 | Nakamura et al. | ........... | 257/659 |
| 7,482,266 B2 * | 1/2009 | Ma | ........... | 438/638 |
| 7,538,025 B2 * | 5/2009 | Chen et al. | ........... | 438/636 |
| 7,642,185 B2 * | 1/2010 | Owada et al. | ........... | 438/624 |
| 7,767,578 B2 * | 8/2010 | Huang et al. | ........... | 438/638 |
| 7,803,705 B2 * | 9/2010 | Kobayashi et al. | ........... | 438/623 |
| 7,851,351 B2 * | 12/2010 | Kikuchi | ........... | 438/627 |
| 7,981,757 B2 * | 7/2011 | Burke et al. | ........... | 438/381 |
| 8,232,200 B1 * | 7/2012 | Oh et al. | ........... | 438/643 |
| 8,314,031 B2 * | 11/2012 | Hsu | ........... | 438/693 |
| 2006/0110912 A1 * | 5/2006 | Lu et al. | ........... | 438/624 |
| 2006/0205206 A1 * | 9/2006 | Xu et al. | ........... | 438/637 |
| 2008/0067145 A1 | 3/2008 | Wang | | |
| 2009/0079083 A1 * | 3/2009 | Yang | ........... | 257/773 |
| 2009/0149031 A1 * | 6/2009 | Kakamu et al. | ........... | 438/763 |
| 2009/0152686 A1 * | 6/2009 | Ide et al. | ........... | 257/632 |
| 2012/0007257 A1 * | 1/2012 | Nomura | ........... | 257/774 |
| 2012/0153500 A1 * | 6/2012 | Kim et al. | ........... | 257/774 |
| 2012/0181694 A1 * | 7/2012 | Usami et al. | ........... | 257/751 |
| 2012/0193785 A1 * | 8/2012 | Lin et al. | ........... | 257/737 |
| 2012/0292741 A1 * | 11/2012 | Dalton et al. | ........... | 257/536 |

* cited by examiner

*Primary Examiner* — Ida M Soward
(74) *Attorney, Agent, or Firm* — Winston Hsu; Scott Margo

(57) ABSTRACT

A metal interconnection structure includes a substrate and a protective layer. The substrate includes at least a first conductive layer. The protective layer is a single-layered structure disposed on the substrate, and a quantity of oxygen (O) in an upper part of the protective layer is more than a quantity of oxygen (O) in a lower part of the protective layer. A material of the upper part of the protective layer includes silicon oxycarbide (SiCO) or silicon oxycarbonitride (SiCNO), and a material of the lower part of the protective layer includes silicon carbide (SiC) or silicon carbonitride (SiCN).

6 Claims, 5 Drawing Sheets

METAL INTERCONNECTION STRUCTURE

BACKGROUND OF THE INVENTION

1. Field of the Invention

The present invention relates to a metal interconnection structure and a method of fabricating a metal interconnection structure, and more particularly, to a metal interconnection structure including a protective layer partially containing oxygen (O) and a method of fabricating the same.

2. Description of the Prior Art

When fabricating semiconductor integrated circuits (ICs), semiconductor devices are connected by several metallic interconnecting layers commonly referred to as multi-level interconnects. A damascene process is a convenient and predominant method for forming the multi-level interconnects. The damascene process includes etching a dielectric material layer to form a trench and/or via patterns, filling the patterns with conductive materials, such as copper, and performing a planarization process. This way, a metal interconnection structure is obtained.

Please refer to FIG. 1, which illustrates a schematic diagram of a conventional dual damascene structure. As shown in FIG. 1, a semiconductor substrate 10 includes a first low dielectric constant (low-K) material layer 12, a first copper conductive wire 14 disposed in the first low-K material layer 12, a protective layer 16 and a second low-K material layer 18 sequentially disposed on the first low-K material layer 12, and a second copper conductive wire 20 disposed in the second low-K material layer 18. The second copper conductive wire 20 is in the trench structure 24 of the dual damascene structure 22, and connects to the first copper conductive wire 14 through the via structure 26 of the dual damascene structure 22 which penetrates through the protective layer 16 between the first low-K material layer 12 and the second low-K material layer 18. Before forming the copper conductive wires, a barrier layer 28 is formed in the dual damascene structure 22, in order to prevent the copper of the copper conductive wires from diffusing into the neighboring dielectric materials. The barrier layer 28 is commonly made of titanium (Ti), titanium nitride (TiN), tantalum nitride (TaN) or tungsten nitride (WN).

The protective layer 16 can be used to prevent the copper of the first copper conductive wire 14 from diffusing into the second low-K material layer 18, and the increase of the thickness of the protective layer 16 may improve the barrier effect of the protective layer 16. However, the too thick protective layer 16 is unfavorable for the semiconductor devices with the trend of miniaturization. Accordingly, how to improve the composition of the protective layer in order to form the protective layer having a predetermined thickness and a predetermined dielectric constant is an important issue in this field.

SUMMARY OF THE INVENTION

An objective of the present invention is therefore to provide a metal interconnection structure and a method of fabricating the same in order to improve a composition of a protective layer of the metal interconnection structure.

According to one exemplary embodiment of the present invention, a method of fabricating a metal interconnection structure includes the following steps. A protective layer is formed on a substrate, and the protective layer includes a single-layered structure. Subsequently, a surface treatment process is performed on the protective layer to add oxygen (O) into a part of the protective layer. At least a dielectric layer is formed on the protective layer, and at least an opening is formed in the dielectric layer and in the protective layer.

According to another exemplary embodiment of the present invention, a metal interconnection structure is provided. The metal interconnection structure includes a substrate and a protective layer. The substrate includes at least a first conductive layer. The protective layer as a single-layered structure is disposed on the substrate, and a quantity of oxygen (O) in an upper part of the protective layer is more than a quantity of oxygen (O) in a lower part of the protective layer.

The surface treatment process includes introducing a reactive gas such as ozone ($O_3$) on the surface of the protective layer, for diffusing oxygen (O) into the protective layer. As a part of the protective layer may include oxygen (O), the dielectric constant of the protective layer will be lowered, which is beneficial for reducing the resistance of the later formed metal interconnection structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

The present invention can be integrated into damascene structure processes for a protective layer having a single-layered structure, especially as the protective layer initially does not contain oxygen (O). For example, the protective layer could be made of silicon carbide (SiC) or silicon carbonitride (SiCN). The damascene structure processes may include dual damascene structure processes such as trench-first process, via-first process or partial via-first process.

Figure 1:
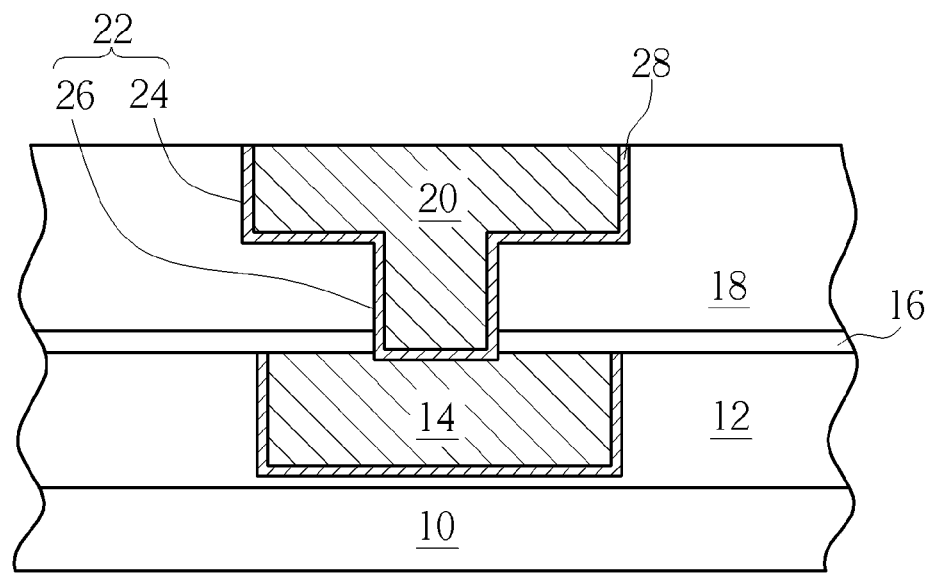
FIG. 1 illustrates a schematic diagram of a conventional dual damascene structure.
Figure 2:
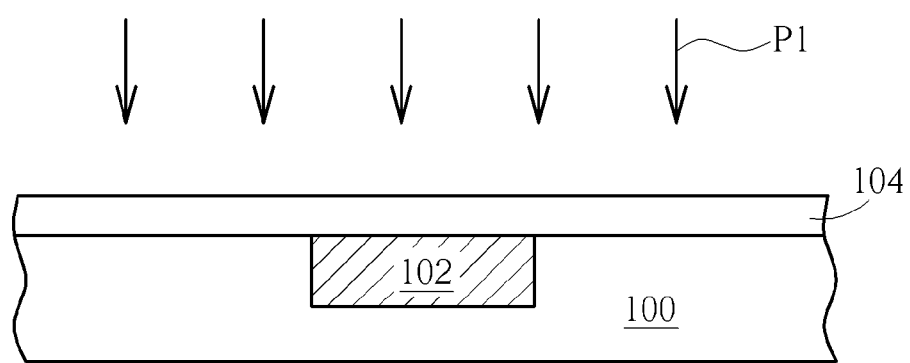
FIG. 2 through FIG. 10 illustrate a method of fabricating a metal interconnection structure according to a preferred exemplary embodiment of the present invention.

Please refer to FIG. 2 through FIG. 10, which illustrate a method of fabricating a metal interconnection structure according to a preferred exemplary embodiment of the present invention. The dual damascene structure process is given as an example in this exemplary embodiment, but the invention is not limited thereto. As shown in FIG. 2, a substrate 100 is provided, and at least a first conductive layer 102 is disposed in the substrate 100. The substrate 100 may include a semiconductor substrate such as a silicon substrate, a silicon containing substrate, a III-V group-on-silicon (such as GaN-on-silicon) substrate, a graphene-on-silicon substrate or a silicon-on-insulator (SOI) substrate, other semiconductor elements (not shown), or a dielectric layer (not shown). The first conductive layer 102 could be any kind of conductive element, including gate electrodes, source electrodes or drain electrodes disposed in the semiconductor substrate, contact plugs, via plugs, conductive lines, or metal contacts disposed in the dielectric layer, etc., or metal contacts. Subsequently, a protective layer 104 is formed on a substrate, and the protective layer 104 directly covers the first conductive layer 102. The protective layer 104 could be a single-layered structure that does not contain oxygen (O). A material of the protective layer includes dielectric materials such as silicon carbide (SiC) or silicon carbonitride (SiCN).

Figure 3:
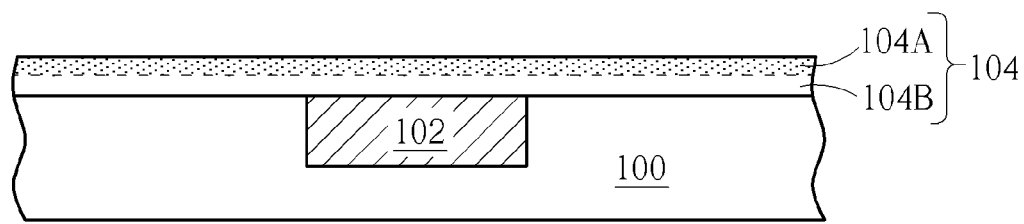

After the formation of the protective layer 104, a surface treatment process P1 is performed on the protective layer 104 to add oxygen (O) into a part of the protective layer 104, as shown in FIG. 3. The surface treatment process P1 includes introducing ozone ($O_3$), and a processing time of the surface treatment process P1 is substantially less than 1 minute. A processing temperature of the surface treatment process P1 is substantially between 200 degrees centigrade (° C.) and 400 degrees centigrade. In this exemplary embodiment, the surface treatment process P1 includes introducing ozone ($O_3$) into the reaction chamber in which the substrate 100 is disposed. For safety, the introduced gas of the surface treatment process P1 may include inert gases such as helium (He), nitrogen ($N_2$) and argon (Ar) in addition to ozone, and the source gas for forming the protective layer 104 is not included in the introducing gas. The pressure of the reaction chamber is maintained below 0.5 atmosphere (atm), and the temperature of the reaction chamber is substantially between 200 degrees centigrade (° C.) and 400 degrees centigrade. The processing time, i.e. the period of introducing ozone, is substantially less than 1 minute.

It should be appreciated that the reactive gas such as ozone ($O_3$) and the thermal energy provided by the reaction chamber in the surface treatment process P1 can diffuse oxygen (O) into a part of the protective layer 104. This means that the protective layer 104A may contain oxygen (O), while the protective layer 104B may not contain oxygen (O). More specifically, because ozone only contacts the exposed surface of the protective layer 104, in the interior of the protective layer 104, the protective layer 104A including oxygen (O) may be disposed on the protective layer 104B without oxygen (O) after the surface treatment process P1. Furthermore, the diffused depth of oxygen (O) (i.e. the thickness of the protective layer 104A) positively corresponds to the processing time of the surface treatment process P1 (i.e. the period of introducing ozone), and preferably smaller than the thickness of the overall protective layer 104. In short, the present invention uses the reactive gas to provide oxygen (O) to the formed protective layer 104 which initially does not include oxygen (O). After the surface treatment process P1, an upper part of the protective layer 104 i.e. the protective layer 104A may therefore include added oxygen (O), and the protective layer 104A preferably does not contact the first conductive layer 102. Moreover, the surface treatment process P1 does not comprise a plasma treatment process in order to avoid damaging the protective layer 104 by plasma bombardment.

In one exemplary embodiment, as a material of the protective layer 104 includes silicon carbonitride (SiCN), a material of the protective layer 104A having oxygen (O) in the protective layer 104 may be silicon oxycarbonitride (SiCNO) after the surface treatment process P1, wherein the dielectric constant (K) of SiCNO is substantially smaller than the dielectric constant of SiCN. In another exemplary embodiment, as a material of the protective layer 104 includes silicon carbide (SiC), a material of the protective layer 104A having oxygen (O) in the protective layer 104 may be silicon oxycarbide (SiCO) after the surface treatment process P1, wherein the dielectric constant of SiCO is substantially smaller than the dielectric constant of SiC. As the dielectric constant of the oxygen-containing dielectric material is substantially smaller than the dielectric constant of the original dielectric material, the overall dielectric constant of the protective layer 104 including the protective layer 104A, i.e. the oxygen-containing protective layer 104, may be smaller than the overall dielectric constant of the original protective layer 104 without performing the surface treatment process P1, i.e. the non-oxygen-containing protective layer 104. In other words, after the formation of the protective layer 104, the surface treatment process P1 is subsequently performed to add oxygen (O) into a part of the protective layer 104 in order to reduce the dielectric constant of the protective layer 104, instead of performing multiple deposition processes to form a composited protective layer, or thinning the thickness of the protective layer. The low dielectric constant can thereby be obtained. The surface treatment process P1 of the present invention can therefore simplify the manufacturing process and save time which would otherwise be used to transfer the source gas or change the process tool.

Figure 4:
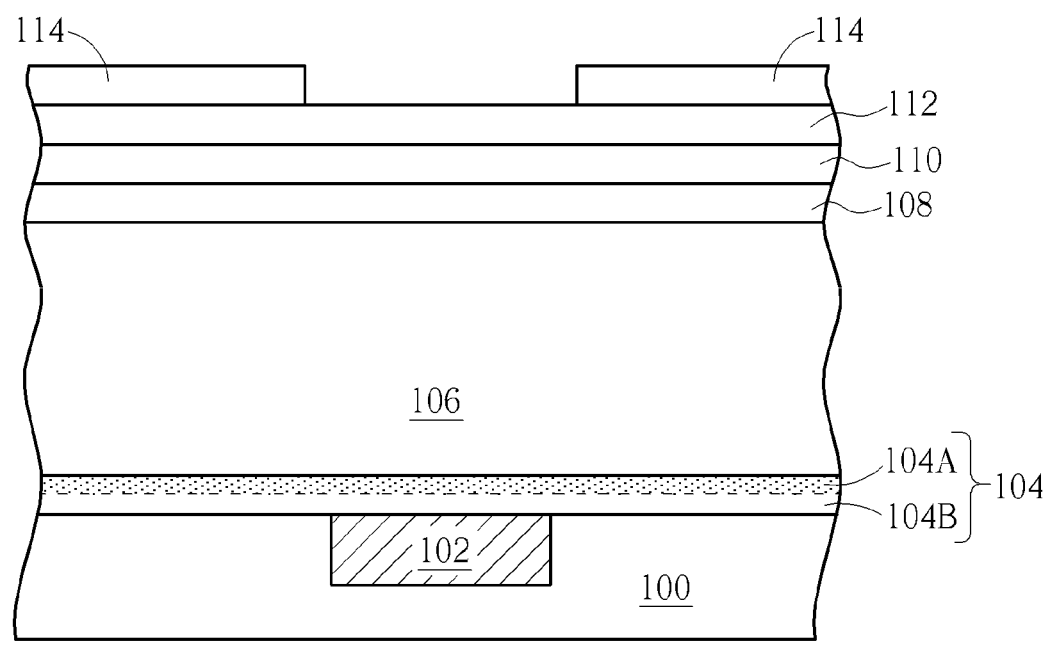

At least a dielectric layer is further formed on the protective layer 14. As shown in FIG. 4, a dielectric layer 106, a dielectric cap layer 108, a metal hard mask layer 110 and a first bottom anti-reflective coating (BARC) film 112 are sequentially formed on the substrate 100. The dielectric layer 106 could be made of dielectric materials through a spin-on-coating (SOC) process or a chemical vapor deposition (CVD) process, where the dielectric materials may include low dielectric constant (low-K) material (K value smaller than 3.9), ultra low-K (ULK) material (K value smaller than 2.6), or porous ULK material, but the materials are not limited thereto. The dielectric cap layer 108 made of dielectric materials includes a single layered structure or a multi-layered structure, for example, a single-layered structure made of silicon oxynitride (SiON) or silicon oxide (SiO), or a composite structure made of silicon oxynitride (SiON) and silicon oxide (SiO) or any combination of other proper dielectric materials, but is not limited thereto. The metal hard mask layer 110 may include a single layered structure or a multi-layered structure made of at least two different materials. For example, a single layered structure includes titanium nitride (TiN) or tantalum nitride (TaN), or a multi-layered structure includes a titanium (Ti) layer and a titanium nitride layer or a tantalum (Ta) layer and a tantalum nitride layer.

Figure 5:
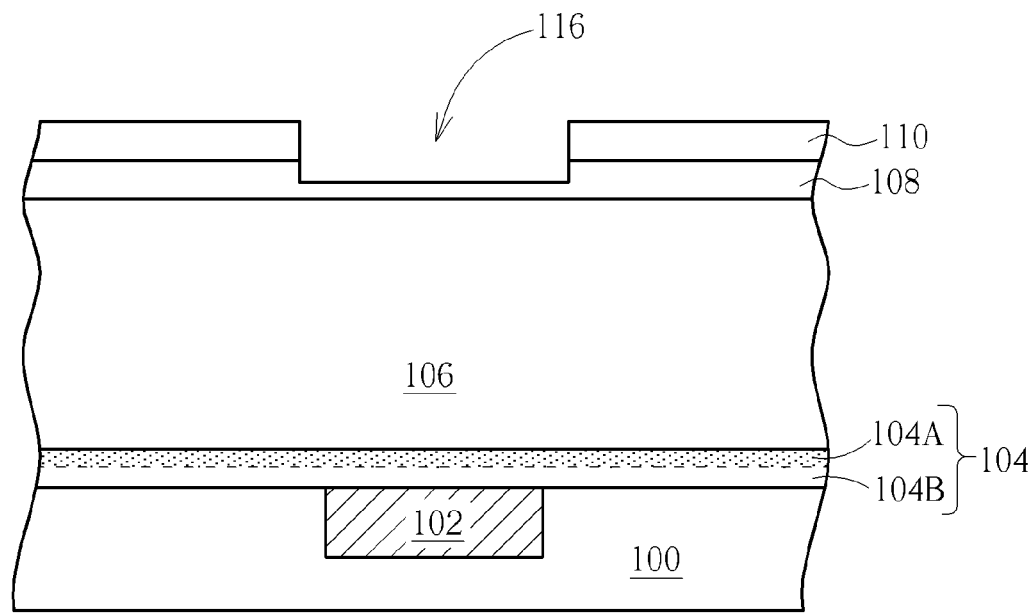

In addition, a first patterned photoresist layer 114 is formed on the first bottom anti-reflective coating (BARC) film 112, in this exemplary embodiment, the pattern of the first patterned photoresist layer 114 are the same as the pattern of the trench structure of the later formed dual damascene structure, but not limited thereto. As shown in FIG. 5, after the formation of the stacked structure as shown in FIG. 4, one or more etching processes are implemented to form a first opening 116 in the dielectric cap layer 108 for defining the pattern of the trench structure of the later formed dual damascene structure. Finally, the anti-reflective coating (BARC) film 112 and the first patterned photoresist layer 114 are removed.

Figure 6:
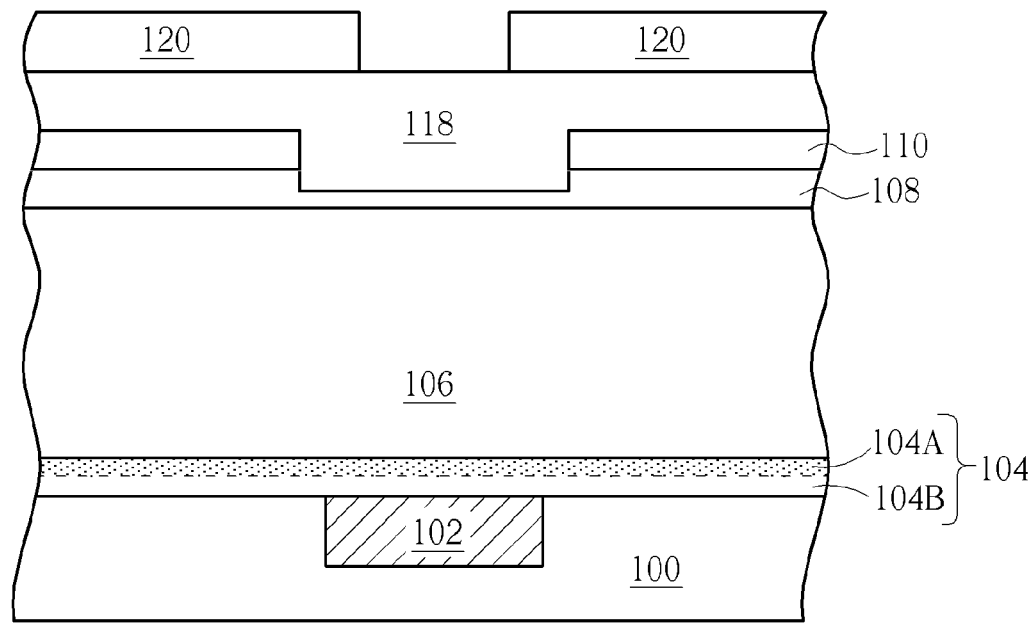
Figure 7:
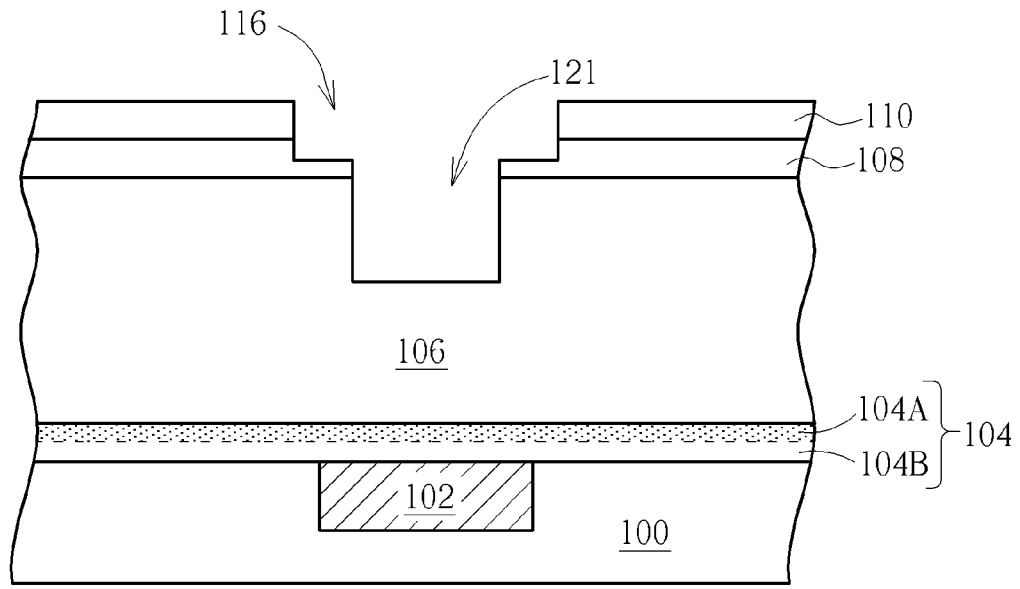

Subsequently, as shown in FIG. 6, a second bottom anti-reflective coating (BARC) film 118 and a second patterned photoresist layer 120 are formed on the substrate 100, the second bottom anti-reflective coating (BARC) film 118 fills the first opening 116 and the pattern of the second patterned photoresist layer 120 are the same as the pattern of the via structure of the later formed dual damascene structure. Furthermore, as shown in FIG. 7, the second patterned photoresist layer 120 is used as a mask and one or more etching processes such as an anisotropic dry etching process are performed to remove the second bottom anti-reflective coating (BARC) film 118, the dielectric cap layer 108 and the dielectric layer 106 not covered by the second patterned photoresist layer 120, in order to form a second opening 121 in the dielectric cap layer 108 and the dielectric layer 106. Finally, the second patterned photoresist layer 120 and the second bottom anti-reflective coating (BARC) film 118 are removed.

In this exemplary embodiment, a width of the second opening 121 is preferably smaller than a width of the first opening 116 for disposing the second opening 121 in the first opening 116. The order of forming the first opening 116 and the second opening 121 is not limited as illustrated above, in other exemplary embodiment, the second opening 121 corresponding to the pattern of the via structure can be formed before the first opening 116 corresponding to the pattern of the trench structure.

Figure 8:
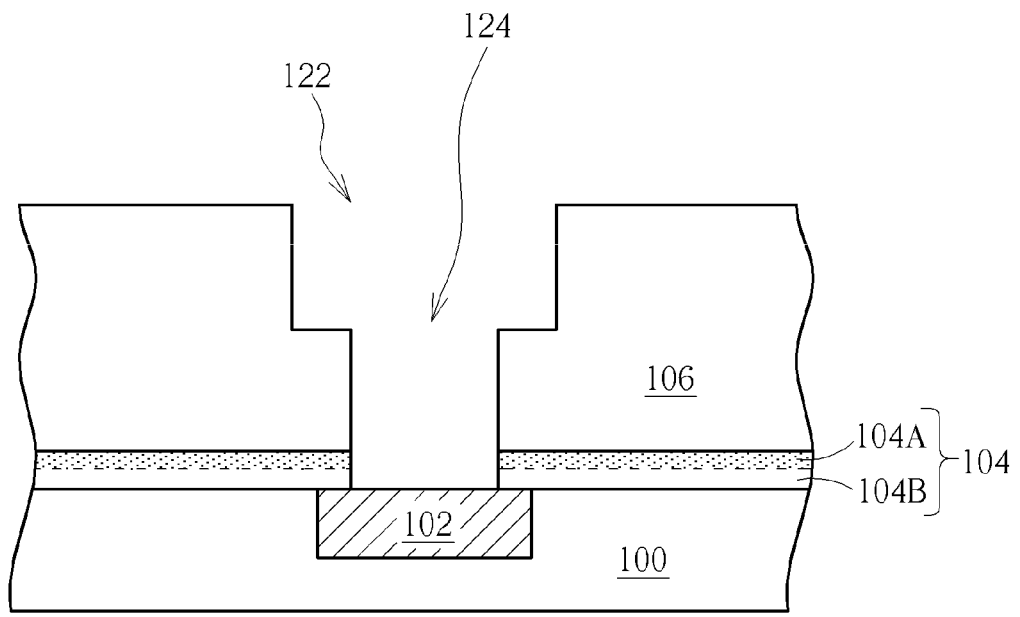

As shown in FIG. 8, one or more etching processes are further performed to simultaneously remove the dielectric cap layer 108 and the dielectric layer 106 not covered by the metal hard mask layer 110. Accordingly, an upper trench 122, and a lower via 124 penetrating through the dielectric layer 106 and the protective layer 104 until reaching the first conductive layer 102 are thereby formed.

Figure 9:
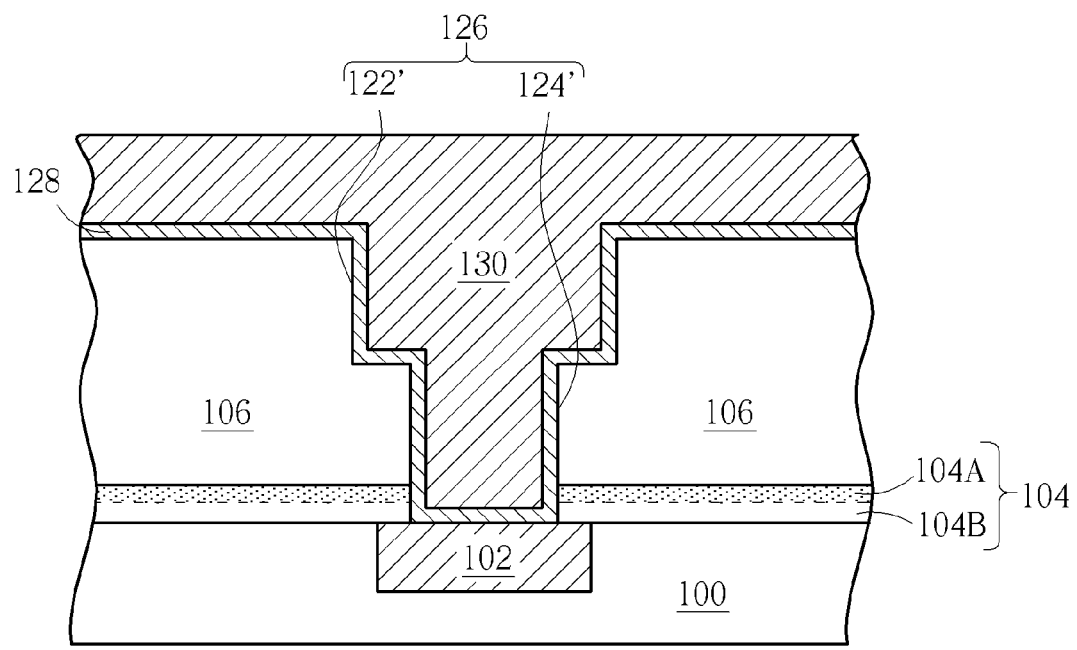

As shown in FIG. 9, a deposition process is performed, and a barrier/glue layer 128 is formed on the substrate 100. The barrier/glue layer 128 could be used for preventing copper (Cu) or tungsten (W) of the later formed second conductive layer 130 from diffusing into the neighboring dielectric layers. The barrier/glue layer 128 could also be made of a composite material such as tantalum/titanium/titanium nitride (Ta/Ti/TiN) or be made of any combination of tantalum (Ta), titanium (Ti), tantalum nitride (TaN) and titanium nitride (TiN). The barrier/glue layer 128 can increase the adhesion between the later formed second conductive layer 130 and the previously formed dielectric layer 106. Furthermore, a seed layer (not shown) and a second conductive layer 130 electrically connecting the first conductive layer 102 are formed on the substrate 100, and the material of the seed layer (not shown) may be the same as the material of the second conductive layer 130. The upper trench 122 and the lower via 124 can be filled up with the second conductive layer 130 to respectively form a trench structure 122' and a via structure 124'; the dual damascene structure 126 is completed by this point.

Figure 10:
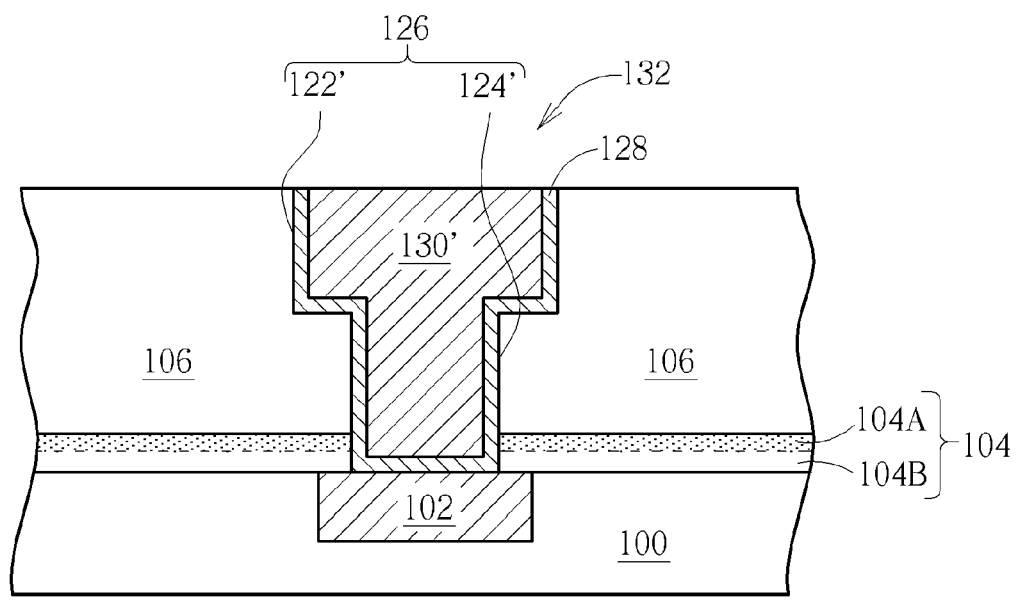

As shown in FIG. 10, a chemical mechanical polishing (CMP) process is performed to remove the second conductive layer 130 outside the trench structure 122' and the via structure 124'. The second conductive layer 130 can be planarized to form the second conductive layer 130', and a surface of the second conductive layer 130' may align with a surface of the dielectric layer 106. Accordingly, the metal interconnection structure 132 is completed.

Please refer to FIG. 10 again. The metal interconnection structure 132 includes the substrate 100, the first conductive layer 102, the protective layer 104 and the first dielectric layer 106 sequentially formed on the substrate 100, and the barrier/glue layer 128 and the second conductive layer 130' sequentially formed on the first conductive layer 102. The substrate 100 includes at least one first conductive layer 102, the protective layer 104 directly contacts the first conductive layer 102, and the second conductive layer 130' electrically connects the first conductive layer 102. The protective layer 104 may be a single-layered structure. It should be appreciated that, a quantity of oxygen (O) in an upper part of the protective layer 104 (i.e. the illustrated protective layer 104A) is more than a quantity of oxygen (O) in a lower part of the protective layer 104 (i.e. the illustrated protective layer 104B). For example, a material of the upper part of the protective layer 104 may be silicon oxycarbide (SiCO), while a material of the lower part of the protective layer 104 may be silicon carbide (SiC). Alternatively, the upper part of the protective layer 104 is an oxygen-rich (O-rich) layer made of silicon oxycarbonitride (SiCNO), and the lower part of the protective layer comprises a nitrogen-rich (N-rich) layer made of silicon carbonitride (SiCN). The upper part of the protective layer 104 including oxygen (O) can improve the adhesion effect between the protective layer 104 and the first dielectric layer 106 including oxygen (O). The lower part of the protective layer 104 preferably does not include oxygen (O) to avoid affecting the performance of the first conductive layer 102.

In conclusion, the surface treatment process includes introducing a reactive gas such as ozone ($O_3$) on the surface of the protective layer, to diffuse oxygen (O) into the protective layer. Therefore, a part of the protective layer may include oxygen (O), and the dielectric constant of the protective layer will be lowered, which is beneficial for reducing the resistance of the later formed metal interconnection structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal interconnection structure, comprising:
   a substrate, wherein the substrate comprises at least a first conductive layer; and
   a protective layer disposed on the substrate, wherein the protective layer comprises a single-layered structure, a quantity of oxygen (O) in an upper part of the protective layer is more than a quantity of oxygen (O) in a lower part of the protective layer, and a material of the upper part of the protective layer comprises silicon oxycarbide (SiCO) or silicon oxycarbonitride (SiCNO), and a material of the lower part of the protective layer comprises silicon carbide (SiC) or silicon carbonitride (SiCN).

2. The metal interconnection structure according to claim 1, wherein the upper part of the protective layer comprises an oxygen-rich (O-rich) layer, and the lower part of the protective layer comprises a nitrogen-rich (N-rich) layer.

3. The metal interconnection structure according to claim 1, wherein the lower part of the protective layer does not comprise oxygen (O).

4. The metal interconnection structure according to claim 1, wherein the protective layer directly contacts the first conductive layer.

5. The metal interconnection structure according to claim 1, further comprising at least a dielectric layer and a second conductive layer disposed on the substrate.

6. The metal interconnection structure according to claim 5, wherein the second conductive layer electrically connecting the first conductive layer.

* * * * *